United States Patent [19]

Beyerlein

[11] 3,722,072

[45] Mar. 27, 1973

[54] ALIGNMENT AND BONDING METHOD FOR SEMICONDUCTOR COMPONENTS

[75] Inventor: Fritz W. Beyerlein, Sunnyvale, Calif.

[73] Assignee: Signetics Corporation, Sunnyvale, Calif.

[22] Filed: Nov. 15, 1971

[21] Appl. No.: 198,813

[52] U.S. Cl. ..................29/471.3, 29/471.1, 29/493, 29/589

[51] Int. Cl. ..........................................B23k 31/02

[58] Field of Search..........29/471.1, 471.3, 488, 493, 29/589, 203 V

[56] References Cited

UNITED STATES PATENTS

| | | | |
|---|---|---|---|
| 3,276,854 | 10/1966 | Felker et al. | 29/589 X |
| 3,537,175 | 11/1970 | Clair et al. | 29/589 X |
| 3,617,682 | 11/1971 | Hall | 29/471.1 X |
| 3,670,396 | 6/1972 | Lindberg | 29/471.3 |

*Primary Examiner*—J. Spencer Overholser
*Assistant Examiner*—Richard Bernard Lazarus
*Attorney*—Paul D. Flehr et al.

[57] ABSTRACT

A method for bonding semiconductor structures of the type including semiconductor devices and bonding pads to lead structures. A semiconductor wafer containing a plurality of the lead structures is adhesively secured to a perforated die carrier with the wafer aligned so that a perforation underlies each semiconductor structure. The semiconductor wafer is then separated into individual semiconductor structures. An indexing mechanism positions the die carrier and hence the wafer so that one of the semiconductor structures is aligned with a bonding position. Another indexing mechanism positions a sheet of lead structures so that one of the lead structures is aligned with the bonding position. Due to orientation of the die carrier and the sheet of lead structures the bonding pads of the semiconductor structure in the bonding position are aligned with the spaced leads of the lead structure and the bonding position. A vacuum chuck travels up through the perforation in the die carrier and carries the semiconductor structure to the lead structure where it is bonded.

9 Claims, 7 Drawing Figures

ALIGNMENT AND BONDING METHOD FOR SEMICONDUCTOR COMPONENTS

BACKGROUND OF THE INVENTION

This invention pertains to a method for bonding semiconductor structures to lead structures and more particularly pertains to such a method in which individual alignment of leads semiconductor structure is eliminated.

Semiconductor integrated circuits are made today in minute configurations. The integrated circuits proper must be attached to larger lead structures for connection to the outside world. Generally, integrated circuits are provided with metallized areas called bonding pads to which the larger lead structures are electrically connected. One prior art technique for making such connections has been for an operator manually to solder or weld a fine gold wire between each bonding pad and the proper lead structure. Such technique is very slow and since it requires so much of the operator's time is consequently very expensive. The prior art also includes what can be generally referred to as flip-chip techniques. With such techniques lead structures are formed with spaced leads extending inwardly and terminating in a pattern identical to the bonding pad pattern on the integrated circuit or semiconductor die. An individual integrated circuit or semiconductor die is then aligned with an individual lead structure and a simultaneous bond is made between the various bonding pads and the individual leads. Such techniques still, however, require the time of an operator to align a semiconductor die or integrated circuit with the lead structure. What is needed is, therefore, a technique which still further minimizes the time and procedures for attaching semiconductor devices to lead structures.

SUMMARY OF THE INVENTION AND OBJECTS

Accordingly, it is an object of this invention to provide an improved apparatus and method for connecting semiconductor dice to lead structures.

It is a more specific object to this invention to provide an apparatus and method for connecting semiconductor dice to lead structures in which alignment of semiconductor dice on a semiconductor wafer is preserved while the semiconductor dice are separated, removed and attached to lead structures.

Briefly, in accordance with one embodiment of the invention, each of a plurality of semiconductor structures of the type including semiconductor devices and having bonding pads arranged in a predetermined pattern, are respectively bonded to a plurality of lead structures each having a plurality of spaced leads also terminating in the predetermined pattern. A semiconductor wafer has a plurality of the semiconductor devices formed therein. The semiconductor wafer is secured to a die carrier which has a plurality of perforations. The semiconductor wafer is aligned with the perforations so that each of the semiconductor structures or dice has a perforation immediately thereunder. The semiconductor wafer is then separated into individual semiconductor structures or dice which individual semiconductor structures are still retained on the die carrier. The die carrier is positioned to position a semiconductor in spaced, aligned relationship with one of the plurality of lead structures. Support means pass through the perforation in the die carrier, detaching the aligned semiconductor structure and carrying it into engagement with the lead structure to which it is aligned. The semiconductor structure is then bonded to the lead structure. The die carrier is successively positioned so that each of the other semiconductor structures in turn underlie and are aligned with a lead structure, with the support means detaching in turn each of the semiconductor structures and carrying them to lead structures where they are bonded.

DESCRIPTION OF THE PREFERRED EMBODIMENTS

Figure 1:
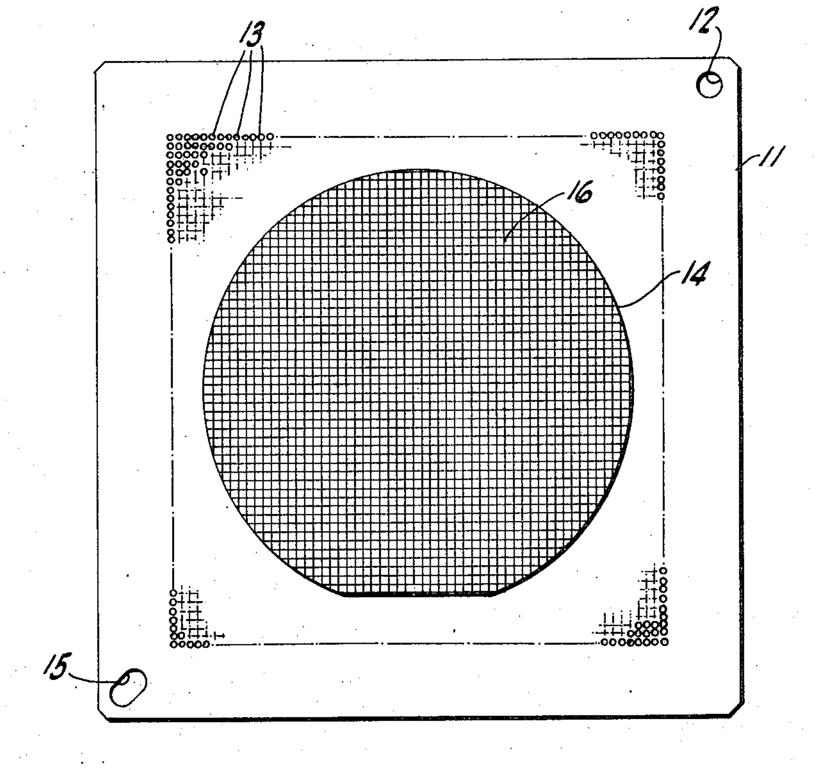
FIG. 1 is a top plan view of a die carrier with a semiconductor wafer affixed thereto.

The apparatus and method of this invention takes a semiconductor structure (i.e., a semiconductor device chip having semiconductor devices formed thereon and metallization patterns formed thereon and having bonding pads located in a predetermined configuration) straight out of an array of semiconductor structures or dice in a wafer and bonds the semiconductor structure to a lead structure without losing the orientation the semiconductor structure or die had in the wafer. In accordance with one embodiment of the invention, a die carrier 11 is provided such as shown in FIG. 1. The die carrier 11 has locating holes 12 and 13 and has an array of perforations 13. A semiconductor wafer 14 containing a plurality of semiconductor dice or structures 16 is positioned on the die carrier 11 and adhesively secured thereto. A pressure or heat sensitive adhesive can be utilized and in accordance with a specific embodiment Beeswax has been found to be satisfactory. The semiconductor wafer 14 is of conventional type with each of the semiconductor structures or dice 16 including semiconductor devices and metallization patterns connecting various semiconductor devices within a single dice and forming bonding pads in a predetermined configuration.

Figure 2:
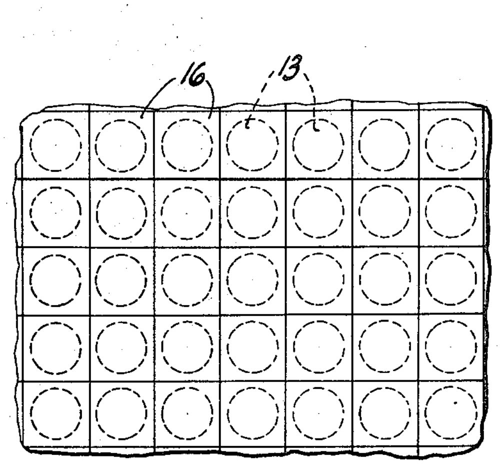
FIG. 2 is an enlarged view of a portion of the semiconductor wafer of FIG. 1 illustrating the relationship between individual semiconductor structures on the wafer and perforations in the die carrier.

As more clearly shown in FIG. 2, the semiconductor wafer 14 is positioned on the die carrier 11 such that each of the individual semiconductor structures or dice 16 is aligned with one of the perforations 13 in die carrier 11. The perforations 13, as can be seen in FIG. 2, have an area less than the area of the semiconductor structures or dice 16. As mentioned above, any suitable non-permanent adhesive can be used for securing the semiconductor wafer 14 to the die carrier 11.

The semiconductor wafer 14 is aligned such that each of the perforations 13 underlie one of the semiconductor dice 16 and the whole semiconductor wafer is aligned with the locating holes 12 and 13 on die carrier 11. The semiconductor wafer 14 is then adhesively secured to the die carrier 11. Thereafter, the semiconductor wafer 14 is diced or separated into individual semiconductor structures or dice 16. This can be accomplished by any of the several conventional methods well known to those skilled in the semiconductor art. For example, such dicing or separation can be accomplished by sawing or by laser cutting. Laser cutting is an especially efficacious method for separating the wafer 14 into individual semiconductor dice 16.

Figure 3:
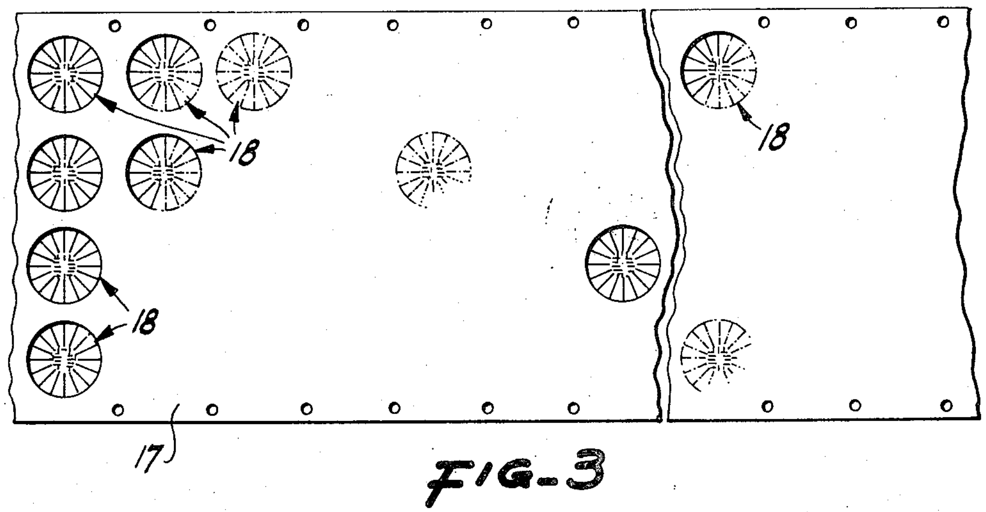
FIG. 3 is a top plan view of a lead structure arrangement suitable for use in this invention and having a plurality of individual lead structures.
Figure 4:
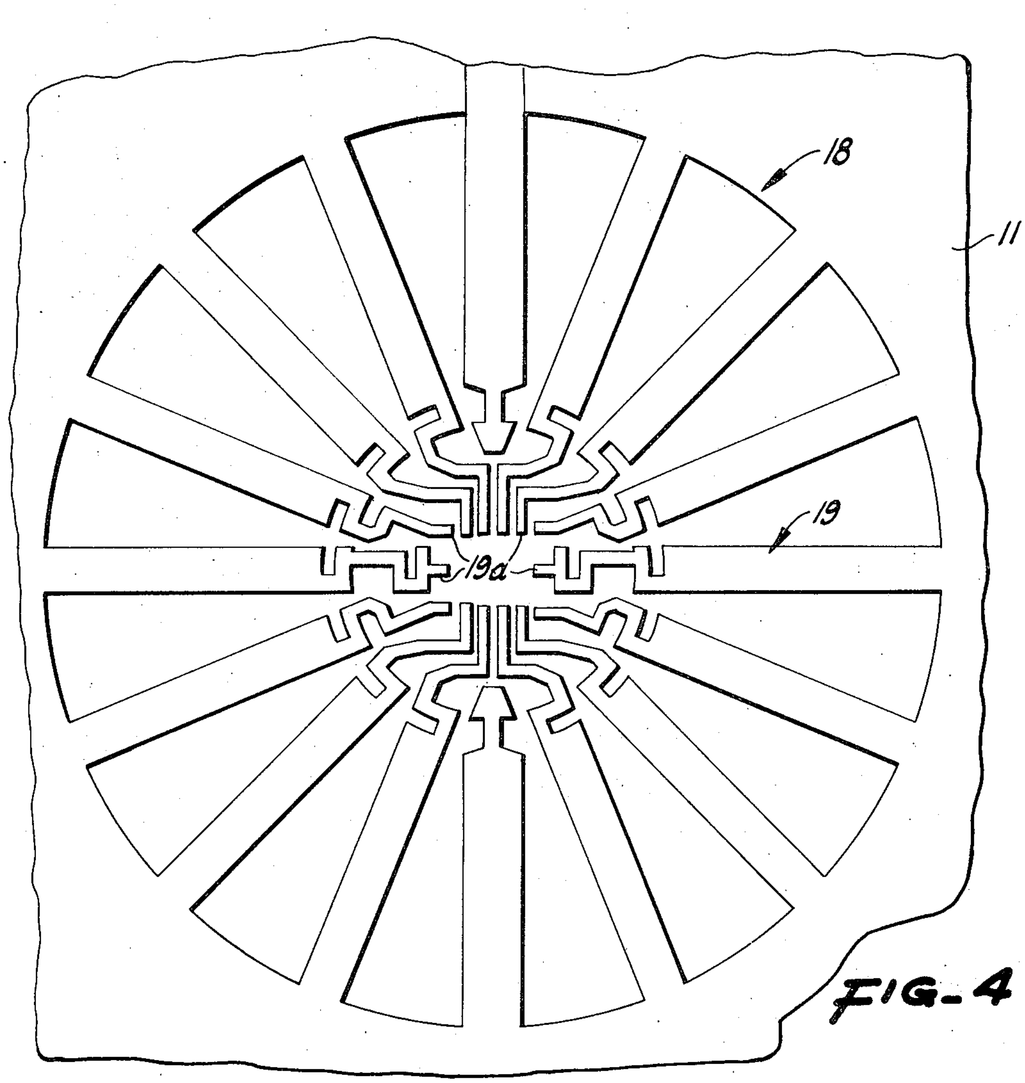
FIG. 4 is an enlarged top plan view of one of the individual lead structures of FIG. 3.

FIG. 3 illustrates one form of lead structures which may be used by the apparatus in the method of this invention. FIG. 3 illustrates a sheet 17 containing a plurality of individual leads structures 18. FIG. 4 is an enlarged top plan view of one of the lead structures 18. These lead structures are specifically discussed in application Ser. No. 93,092 filed Nov. 27, 1970 entitled "Packaged Semiconductor Article and Method for Fabricating the Same," which is assigned to the assignee of the present invention. As may be seen in FIG. 4, each of the lead structures 18 include a plurality of inwardly extending leads 19 which terminate in portions **19*a*** in a predetermined configuration which corresponds to a predetermined configuration of contact pads on a semiconductor structure of die.

Figure 5:
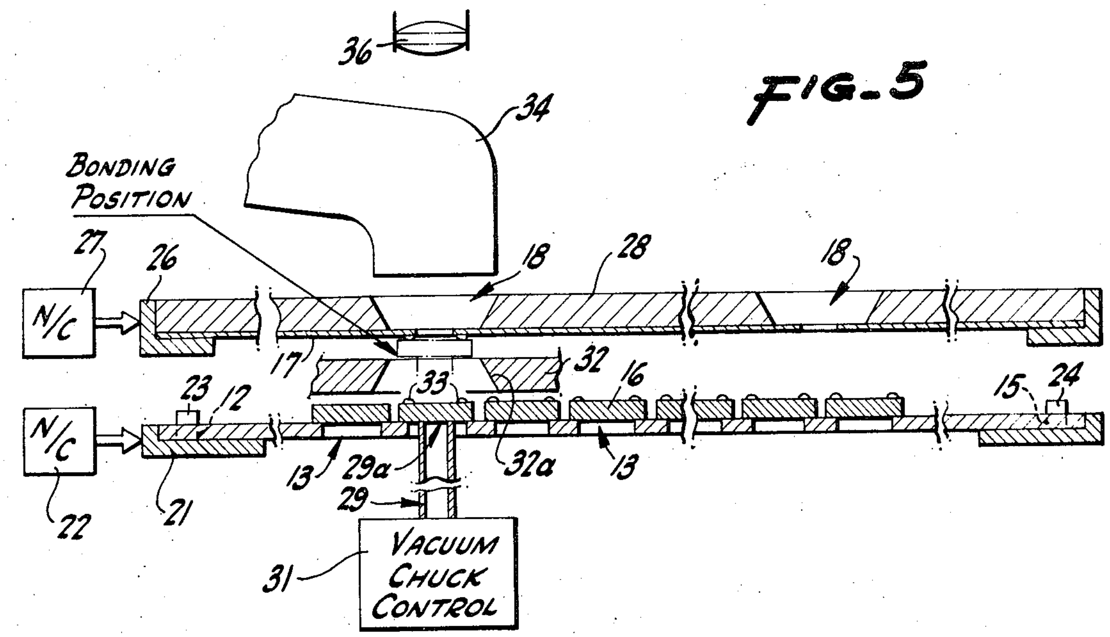
FIG. 5 is a side view partly in cross-section of positioning and bonding apparatus for bonding semiconductor structures to lead structures in accordance with the method of this invention.

FIG. 5 is a diagrammatic cross-sectional view of apparatus for bonding semiconductor dice to the lead structures of FIGS. 3 and 4 in accordance with the method of this invention. The die carrier 11 with the separated semiconductor structures or dice 16 still retained thereon by heat or pressure sensitive adhesive is located on a stepping stage 21 under control of a numerical control system 22. The die carrier 11 is suitably oriented on the stepping stage 21 by locating pins 23 and 24 which extend respectively through the locating holes 12 and 13 of the die carrier 11. An additional stepping stage 26 is also provided in spaced relationship with the stepping stage 21 and is controlled by a numerical control system 27. The stepping stage 26 is adapted to receive in accordance with this one embodiment, the sheet of lead structures 17 having a plurality of individual lead structures 18 formed therein. An additional support member 28 in the form of a sheet having a plurality of apertures corresponding to and generally larger than the individual lead structures 18 may be provided on top of the sheet 17 for giving additional support to the sheet 17 in the area surrounding the individual lead structures 18. The numerical control system 22 positions the stepping stage 21 so that one of the semiconductor dice 16 on the die carrier 11 is aligned with a bonding position. Similarly, the numerical control system 27 positions the stepping stage 26 so that one of the lead structures 18 is also at the bonding position in spaced relationship with the die carrier 16 at the bonding position. Also, aligned with the bonding position is a vacuum chuck 29 controlled by a vacuum chuck control 31. The vacuum chuck 29 has a diameter smaller than the diameter of the perforations 13 and the die carrier 11 and has a vacuum face **29*a* to which vacuum may be selectively applied. The vacuum chuck control 31 is adapted to move the vacuum chuck 29 up through the perforation 13 underlying the semiconductor dice in the bonding position and to disengage the semiconductor dice 16 from the die carrier 11. The vacuum applied to the vacuum chuck 29 serves to hold the semiconductor structure or dice 16 while the vacuum chuck 29 is moved upwards and carried into contact with the lead structure 18 in the bonding position. Although not essential to the invention, a guide 32 may be provided intermediate the stepping stage 21 and the stepping stage 26 and having sloping sides 32*a* defining a guide aperture for assisting in guiding this semiconductor device 16 into engagement with the lead structure 18 at the bonding position. If a pressure sensitive adhesive is used for securing the semiconductor dice 16 to the die carrier 11, the movement of the vacuum chuck 29 upwards is sufficient to disengage the semiconductor dice from the die carrier. If a heat sensitive adhesive, such as beeswax, is utilized for securing the semiconductor dice to the die carrier then the vacuum chuck 29 may conveniently be heated. In accordance with one specific embodiment of the invention wherein beeswax was utilized for securing the semiconductor wafer and hence the semiconductor dice to the die carrier, the vacuum chuck 29 was heated to 80° C for releasing the adhesive bond between the semiconductor dice 16 and the die carrier 11. In accordance with the method of this invention, individual alignment of semiconductor die 16 with an individual lead structure is not necessary. Initial alignment of the semiconductor wafer with the die carrier properly aligns all the individual semiconductor dice 16. The heat or pressure sensitive adhesive maintains this alignment while the semiconductor wafer is separated into individual dice. Thus, when the stepping stage 21 positions a semiconductor dice 16 in spaced relationship with a lead structure 18 positioned at a bonding position by the stepping stage 26, the contact pads on the semiconductor dice 16 are in alignment with the individual leads in the lead structure 18** to which they are respectively to be bonded.

Any of the well known bonding techniques may be utilized for bonding the semiconductor dice 16 to the lead structures 8. These include, for example, thermocompression bonding and ultrasonic bonding such as described in U.S. Pat. No. 3,255,511 to Weissenstern et al. Also suitable is the specific method illustrated in FIG. 5 in which controlled collapse contact bumps formed of solder, for example, and generally indicated by reference numeral 33 are provided on the semiconductor dice 16. After the vacuum chuck 29 carries the semiconductor dice 16 upwards so that the controlled collapse contact bumps 33 are in engagement with the individual leads of the lead structure 18, then a bonding torch 34, which may, for example, be a $N_2/H_2$ torch producing a temperature on the order of 500° C, applies heat to the mating surfaces of the contact bumps and the leads so as to melt the contact bumps and form solder connections between the bonding pads of the semiconductor dice 16 and the individual leads of the lead structure 18.

A microscope 36 may be provided aligned with the bonding position for confirming the alignment between the semiconductor die 16 and the lead structure 18 and observing bonding thereof. After a semiconductor dice 16 has been bonded to a lead structure 18, then the stepping stage 21 is stepped by the numerical control system 22 to a new position to position another of the semiconductor dice 16 in the bonding position. Likewise, the numerical control system 27 positions the stepping stage 26 to a new position so that another of the lead structures 18 is also aligned with the bonding position. In this manner all of the semiconductor dice contained in a semiconductor wafer (the number of which, of course, depends upon many factors but a 2 inch diameter wafer can contain several hundred separate dice) can each be respectively bonded to lead structures without the necessity of individually aligning contact pads on an individual semiconductor die with leads of an individual lead structure. This provides a completely automatic and rapid and inexpensive method for achieving such bonding.

If desired or necessitated by especially critical alignment tolerances between lead structures and contact pads on a semiconductor die, the vacuum chuck 29 may be manually controllable in X, Y and $\theta$ directions for making fine alignment adjustments of the contact pads on a semiconductor die 16 in the bonding position with the leads of a lead structure 18 in the bonding position. This fine alignment procedure can be monitored by the microscope 36. Even if these fine manual alignment adjustments are necessary, by utilizing the method of this invention in which alignment of all the semiconductor dice in a semiconductor wafer is preserved, the time required for alignment and bonding is substantially lessened over the prior art.

Figure 6:
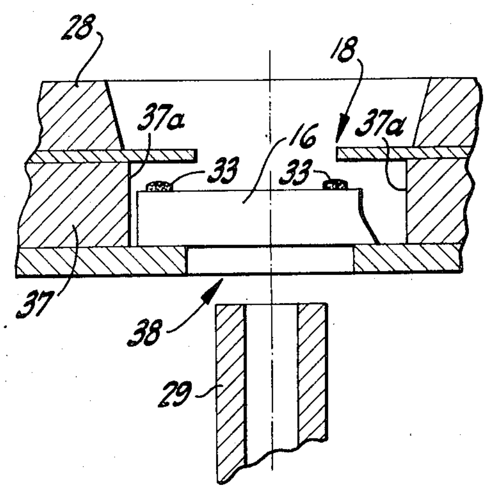
FIG. 6 is a side view partially in cross-section of an alternate embodiment of the invention in which individual semiconductor structures are retained in a die locator.
Figure 7:
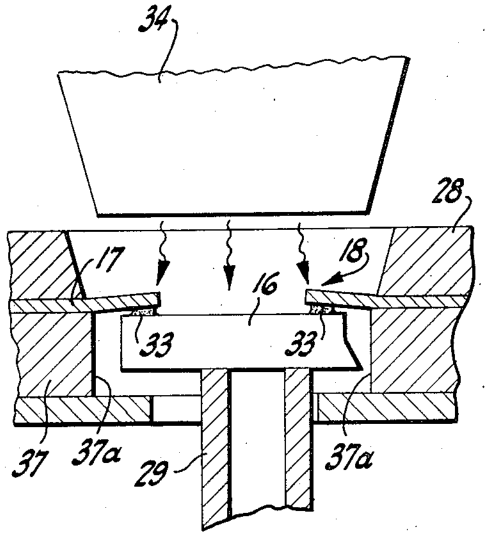
FIG. 7 is similar to FIG. 6 and illustrates the manner in which semiconductor structures retained in the die locator of FIG. 5 are bonded to lead structures.

FIGS. 6 and 7 also illustrate an embodiment of the invention which is less than totally automatic. Thus, in FIG. 6 a die locator 37 is provided which has a plurality of pockets formed by side walls **37*a* with an opening or perforation generally indicated by reference numeral 38 formed in the bottom of each pocket. Individual semiconductor dice 16 may then be manually placed in the die locator 37 in the pockets thereof. As before, a lead arrangement 17 has a plurality of lead structures 18 formed therein and a support member 28 may be provided for supporting the lead arrangement 17 in the vicinity of lead structures 18. Indexing mechanisms in the form of numerically controlled stepping stages are, as before, provided for both the lead structures 17 and the die locator 37. This indexing mechanism positions the die locator such that one of the semiconductor dice 16 is in a bonding position and one of the lead structures 18 is also in spaced relationship with the die 16 and also in the bonding position. Then a vacuum chuck 29 is adapted to be moved upward through the opening 38 in the die locator for contacting the die 16, holding it, and carrying it upwards to that the contact bumps 33 formed on the bonding pads of the semiconductor die 16 respectively engage individual leads of the lead structure 18. Then, as before, a bonding torch 34 may be utilized for applying heat to the mating surfaces of the contact bumps and the individual leads of the lead structure 18 for forming solder connections therebetween as shown in FIG. 7. Then the vacuum chuck 29 is withdrawn, and the indexing mechanisms for the die locator 37 and the lead arrangement 17 position another semiconductor die and another of the individual lead structures 18 in the bonding position so that the process is repeated. In this arrangement, some manual alignment of the semiconductor dice 16 is usually required and to that end X, Y and $\theta$ manual adjustments for the vacuum chuck 29 are provided as well as the Z movement of the chuck which is up through the perforation 38 to engage the semiconductor dice 16 and carry it into engagement with the leads of the lead structures 18**.

Thus, what has been described is a method in which semiconductor structures or dice of the type having contact pads in a predetermined configuration are efficiently and rapidly bonded to lead structures having individual leads terminating in the same predetermined configuration. Different embodiments of the invention include a fully automatic method in which only one alignment is necessary of a semiconductor wafer, which can contain hundreds of individual semiconductor dice. Individual alignment of each of the contact pads on each semiconductor dice with individual lead structures is not necessary. Other semi-automatic embodiments of the invention provide for fine adjustment of the orientation of each individual semiconductor dice with each individual lead structure when necessary.

The embodiments of the invention specifically discussed herein have been shown and described with reference to lead arrangements of the type illustrated in FIGS. 3 and 4 which are more fully described in application Ser. No. 93,092 filed Nov. 27, 1970 for "-Packaged Semiconductor Article and Method for Fabricating the Same." The apparatus and method of this invention are also suitable for use with other lead arrangements. For example, these other suitable lead arrangements include what has come to be known in the art as beam lead arrangements in which a common support member or substrate formed of insulating material is provided with a plurality of lead patterns formed thereon. The lead patterns may be either raised metallization or imbedded metallization but terminate in leads having a configuration which corresponds to contact pads on a semiconductor die which is bonded thereto. Examples of these arrangements are shown in U.S. Pat. No. 3,341,649 and U.S. Pat. No. 3,388,301, both of which are assigned to the assignee of the present invention.

I claim:

1. An alignment and bonding method for mounting each of a plurality of semiconductor structures to each of a plurality of lead structures where the semiconductor structures are of the type including semiconductor devices and having bonding pads arranged in a predetermined pattern and where the lead structures are of the type having a plurality of spaced leads arranged in the predetermined pattern of the semiconductor bonding pads comprising the steps of placing the plurality of semiconductor structures respectively on a carrier having a plurality of perforations smaller than the semiconductor structures so that a perforation underlies each of the semiconductor structures, successively positioning the carrier to position, one at a time, each semiconductor structure in spaced aligned relationship with one of the plurality of lead structures, successively detaching each spaced aligned semiconductor structure from the carrier by support means passing through the perforation in the die carrier underlying the aligned semiconductor structure, carrying the semiconductor structure by these support means to the lead structure so that the plurality of bonding pads mate with the plurality of spaced leads, and bonding the bonding pads to the spaced leads.

2. A method as in claim 1 wherein the carrier is positioned to position one of the semiconductor structures at a bonding position and including the step of positioning the plurality of lead structures to position one of the lead structures at the bonding position in spaced aligned relationship to the semiconductor structure at the bonding position.

3. A method as in claim 1 including the step of rotating and translating as necessary the support means and hence the semiconductor structure carried thereby to exactly align bonding pads on the semiconductor structure with leads of the lead structure.

4. An alignment and bonding method for mounting each of a plurality of semiconductor structures to each of a plurality of lead structures where the semiconductor structures are of the type including semiconductor devices and having bonding pads arranged in a predetermined pattern, which plurality of semiconductor structures are formed spaced on predetermined centers in an array in a semiconductor wafer and where the lead structures are of the type having a plurality of spaced leads arranged in the predetermined pattern of the semiconductor bonding pads, comprising the steps of aligning the semiconductor wafer with a die carrier having an array of perforations formed therein and spaced on the predetermined centers such that each of the semiconductor structures is aligned with one of the perforations, adhesively securing the aligned semiconductor wafer to the die carrier, separating the semiconductor wafer into individual semiconductor structures with each semiconductor structure being adhesively retained on the die carrier, successively positioning the die carrier to position, one at a time, each semiconductor structure in spaced, aligned relationship with one of the plurality of lead structures, successively detaching each spaced aligned semiconductor structure from the die carrier by support means passing through the perforation in the die carrier underlying the aligned semiconductor structure, carrying the semiconductor structure by the support means to the lead structures so that the plurality of the bonding pads mate with the plurality of spaced leads, and bonding the bonding pads to the spaced leads.

5. A method as in claim 4 wherein the die carrier is positioned to position one of the semiconductor structures at a bonding position and including the step of positioning the plurality of lead structures to position one of the lead structures at the bonding position in spaced aligned relationship with the semiconductor structure at the bonding position.

6. A method as in claim 5 wherein a plurality of lead structures are retained in an aligned array so that when the aligned array of lead structures is positioned to position one of the lead structures at the bonding position, the spaced leads of that lead structure are in alignment with the bonding pads of the semiconductor structure positioned at the bonding position.

7. A method as in claim 4 wherein the aligned semiconductor wafer is adhesively secured to the die carrier with a heat sensitive adhesive and including the step of heating the support means to facilitate detaching each spaced aligned semiconductor structure from the die carrier.

8. A method as in claim 4 wherein the support means has a vacuum face and including the step of applying vacuum thereto for holding a semiconductor structure to the support means while the support means carries the semiconductor structure to the lead structure.

9. A method as in claim 4 wherein the semiconductor structure while it is being carried by the support means is guided by a guide structure interposed between the die carrier and the plurality of lead structures.

* * * * *